(12) United States Patent
Wu et al.

(10) Patent No.: US 9,070,679 B2
(45) Date of Patent: Jun. 30, 2015

(54) SEMICONDUCTOR PACKAGE WITH A SEMICONDUCTOR DIE EMBEDDED WITHIN SUBSTRATES

(75) Inventors: Albert Wu, Palo Alto, CA (US);
Shiann-Ming Liou, Campbell, CA (US);
Scott Wu, San Jose, CA (US)

(73) Assignee: Marvell World Trade Ltd., St. Michael (BB)

( * ) Notice: Subject to any disclaimer, the term of this patent is extended or adjusted under 35 U.S.C. 154(b) by 402 days.

(21) Appl. No.: 12/942,918

(22) Filed: Nov. 9, 2010

(65) Prior Publication Data

US 2011/0121444 A1    May 26, 2011

Related U.S. Application Data

(60) Provisional application No. 61/264,191, filed on Nov. 24, 2009.

(51) Int. Cl.
*H01L 21/56*     (2006.01)
*H01L 23/498*    (2006.01)
*H01L 23/538*    (2006.01)

(52) U.S. Cl.
CPC ...... *H01L 23/49833* (2013.01); *H01L 23/5389* (2013.01); *H01L 2224/16227* (2013.01); *H01L 2924/15311* (2013.01); *H01L 2224/16225* (2013.01); *H01L 2924/15151* (2013.01)

(58) Field of Classification Search
CPC .......... H01L 2224/16225; H01L 2924/15311; H01L 2924/15151
USPC ......... 257/693, 666–668, 291–291, 777, 778, 257/791, E21.502, E23.069; 438/15, 106, 438/112
See application file for complete search history.

(56) References Cited

U.S. PATENT DOCUMENTS

| | | | | |
|---|---|---|---|---|
| 5,302,850 A * | 4/1994 | Hara | ............... | 257/667 |
| 5,357,672 A * | 10/1994 | Newman | ........... | 29/830 |
| 5,399,805 A * | 3/1995 | Tyler et al. | ............. | 174/529 |
| 5,736,780 A | 4/1998 | Murayama | | |
| 6,678,167 B1 * | 1/2004 | Degani et al. | ............ | 361/760 |
| 7,015,128 B1 * | 3/2006 | Chiang et al. | ............ | 438/612 |
| 2002/0166688 A1 | 11/2002 | Smith | | |
| 2003/0168749 A1 * | 9/2003 | Koike | ............. | 257/791 |
| 2004/0203194 A1 * | 10/2004 | Hamasaki | ........ | 438/127 |
| 2004/0222534 A1 | 11/2004 | Sawamoto et al. | | |
| 2005/0006739 A1 | 1/2005 | Howard et al. | | |
| 2008/0111233 A1 * | 5/2008 | Pendse | ........... | 257/712 |
| 2009/0108433 A1 | 4/2009 | Masumoto et al. | | |
| 2009/0174081 A1 | 7/2009 | Furuta | | |
| 2011/0037155 A1 * | 2/2011 | Pagaila | ........... | 257/686 |

FOREIGN PATENT DOCUMENTS

CN    1519931 A    8/2004
EP    1 478 023 A1    11/2004

* cited by examiner

*Primary Examiner* — Marcos D Pizarro Crespo
*Assistant Examiner* — Sue Tang (57) ABSTRACT

Embodiments of the present disclosure provide configurations for a semiconductor package and associated methods of fabricating the semiconductor package. A method of fabricating a semiconductor package includes attaching a semiconductor die to a first substrate, attaching a second substrate to the first substrate, wherein the semiconductor die is embedded in between the first substrate and the second substrate, and forming an electrically insulative structure to substantially encapsulate the semiconductor die, wherein forming the electrically insulative structure is performed subsequent to the second substrate being attached to the first substrate. Additional embodiments may be described and/or claimed.

11 Claims, 5 Drawing Sheets

SEMICONDUCTOR PACKAGE WITH A SEMICONDUCTOR DIE EMBEDDED WITHIN SUBSTRATES

CROSS REFERENCE TO RELATED APPLICATIONS

This disclosure claims priority to U.S. Provisional Patent Application No. 61/264,191, filed Nov. 24, 2009, the entire specification of which is hereby incorporated by reference in its entirety for all purposes, except for those sections, if any, that are inconsistent with this specification.

TECHNICAL FIELD

Embodiments of the present disclosure relate to the field of integrated circuits, and more particularly, to semiconductor packaging techniques, structures, and configurations for embedded chip packages.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Integrated circuit devices, such as transistors, are formed on semiconductor dies that continue to scale in size to smaller dimensions. Generally, semiconductor dies are mounted on a substrate and encapsulated with a mold compound to form a semiconductor package. However, such conventional packaging may not provide a sufficiently small semiconductor package to accommodate shrinking form factors for emerging electronic devices such as, for example, phones, computers, or other digital assemblies that use the semiconductor dies.

SUMMARY

In one embodiment, the present disclosure provides a method of fabricating a semiconductor package, the method including attaching a semiconductor die to a first substrate, attaching a second substrate to the first substrate, wherein the semiconductor die is embedded in between the first substrate and the second substrate, and forming an electrically insulative structure to substantially encapsulate the semiconductor die, wherein forming the electrically insulative structure is performed subsequent to the second substrate being attached to the first substrate.

BRIEF DESCRIPTION OF THE DRAWINGS

Embodiments of the present disclosure will be readily understood by the following detailed description in conjunction with the accompanying drawings. To facilitate this description, like reference numerals designate like structural elements. Embodiments herein are illustrated by way of example and not by way of limitation in the figures of the accompanying drawings.

DETAILED DESCRIPTION

Embodiments of the present disclosure describe semiconductor packaging techniques, structures, and configurations for embedded chip packages. In the following detailed description, reference is made to the accompanying drawings which form a part hereof, wherein like numerals designate like parts throughout. Other embodiments may be utilized and structural or logical changes may be made without departing from the scope of the present disclosure. Therefore, the following detailed description is not to be taken in a limiting sense, and the scope of embodiments is defined by the appended claims and their equivalents.

The description may use perspective-based descriptions such as up/down and top/bottom. Such descriptions are merely used to facilitate the discussion and are not intended to restrict the application of embodiments described herein to any particular orientation.

For the purposes of the present disclosure, the phrase "A/B" means A or B. For the purposes of the present disclosure, the phrase "A and/or B" means "(A), (B), or (A and B)." For the purposes of the present disclosure, the phrase "at least one of A, B, and C" means "(A), (B), (C), (A and B), (A and C), (B and C), or (A, B and C)." For the purposes of the present disclosure, the phrase "(A)B" means "(B) or (AB)" that is, A is an optional element.

Various operations are described as multiple discrete operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

The description uses the phrases "in an embodiment," "in embodiments," or similar language, which may each refer to one or more of the same or different embodiments. Furthermore, the terms "comprising," "including," "having," and the like, as used with respect to embodiments of the present disclosure, are synonymous.

Figure 1A:
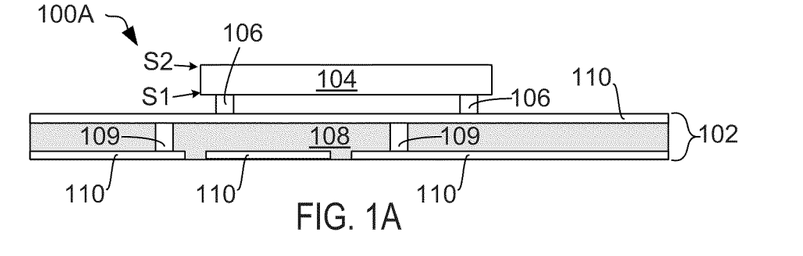
FIGS. 1A-1C schematically illustrate a semiconductor package subsequent to various process operations, in accordance with various embodiments.
Figure 1B:
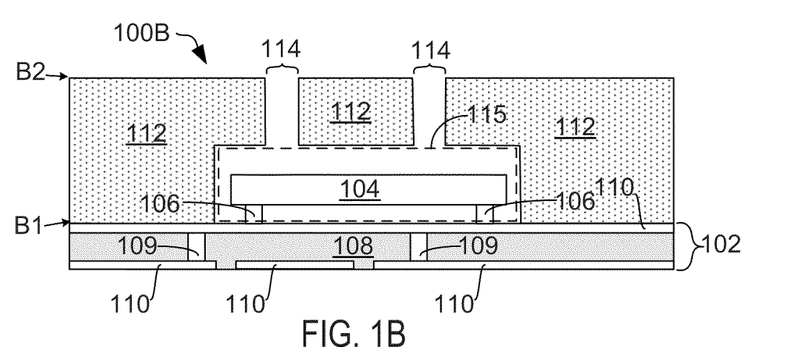
Figure 1C:
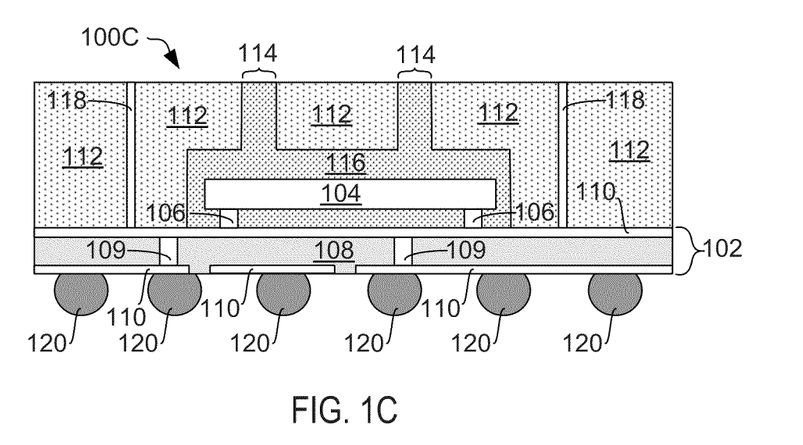

FIGS. 1A-1C schematically illustrate a semiconductor package subsequent to various process operations, in accordance with various embodiments. Referring to FIG. 1A, a semiconductor package 100A is depicted subsequent to attaching a semiconductor die 104 to a first substrate 102. According to various embodiments, the semiconductor die includes a first surface, S1, that is attached to the first substrate 102 and a second surface, S2, that is opposite to the first surface. The first surface S1 can include, for example, an active surface of a semiconductor substrate upon which a plurality of integrated circuit (IC) devices (not shown) such as transistors for logic and/or memory are formed.

The first surface S1 of the semiconductor die 104 is electrically coupled to the first substrate 102 using one or more interconnect bumps 106. The one or more interconnect bumps 106 can include any of a variety of suitable posts, balls, studs, or other similar structures to electrically couple the semiconductor die 104 and the first substrate 102. In an embodiment, the one or more interconnect bumps 106 include stud-bumps comprising gold (Au). Other electrically conductive materials can be used to form the one or more interconnect bumps 106 including, for example, copper (Cu) or aluminum (Al).

The semiconductor die 104 can include a wide variety of types of dies including, for example, dies associated with data storage, logic, wireless chips, system-on-a-chip (SOC), liquid crystal displays (LCD), and other applications or configurations. The semiconductor die generally comprises silicon, but is not limited in this regard. Other semiconductor materials can be used to fabricate the semiconductor die 104.

The first substrate 102 generally includes a core 108 comprising an electrically insulative material. One or more traces 110 or similar electrically conductive features (e.g., bond pads, not shown) are formed on opposing surfaces of the first substrate 102 to route electrical signals such as, for example, power and/or input/output (I/O) signals to or from the semiconductor die 104. One or more vias 109 are formed in the first substrate 102 to electrically couple the one or more traces 110 formed on the opposing surfaces of the first substrate 102, as shown. The one or more vias 109 can include, for example, through-hole vias (THVs) or a series of redistribution interconnect layers that route signals between the opposing surfaces of the first substrate 102. According to various embodiments, the one or more traces 110 and the one or more vias 109 are formed using an electrically conductive material such as, for example, copper. Other electrically conductive materials can be used in other embodiments.

According to various embodiments, the first substrate 102 is a flex circuit substrate 102 having a core 108 comprising polyimide. The first substrate 102 can be used, for example in liquid crystal display (LCD) applications such as, for example, in an LCD driver assembly tape circuit board.

Referring to FIG. 1B, a semiconductor package 100B is depicted subsequent to attaching a second substrate 112 to the first substrate 102 to embed the semiconductor die 104 between the first substrate 102 and the second substrate 112, as shown. The second substrate 112 is attached to a surface of the first substrate 102 using any suitable attachment process including, for example, using an adhesive such as epoxy. The second substrate 112 may include a variety of electrically conductive structures (not shown) to route electrical signals to or from the first substrate 112.

According to various embodiments, the second substrate 112 comprises a printed circuit board (PCB) that is fabricated to include a region 115 for the semiconductor die 104. For example, the semiconductor die 104 is disposed within the region 115 subsequent to attaching the second substrate 112 to the first substrate 102, as shown in the semiconductor package 100B. The region 115 can be formed prior to attachment of the second substrate 112 to the first substrate 102 using a process to stamp out the region 115 to provide a pre-stamped substrate. Other techniques can be used to form the region 115 such as, for example, using a mold or removing material by etching or a similar process.

The second substrate 112 includes a first surface, B1, that is attached to the first substrate 102 and a second surface, B2, that is opposite to the first surface B1, as shown. One or more channels 114 (e.g., may be referred to as injection channels) are formed in the second substrate 112 to provide a pathway for deposition of an electrically insulative material to encapsulate the semiconductor die 104. According to various embodiments, the one or more channels 114 are formed between the second surface B2 of the second substrate 112 and the region 115 for the semiconductor die 104, as shown. In an embodiment, the one or more channels 114 include at least two channels, as shown. A plurality of channels may provide a more even flow distribution for the encapsulating material than a single channel.

According to various embodiments, the second substrate 112 comprises a C-stage material. The C-stage material may be, for example, a final stage material in a reaction of thermosetting resins in which the material is substantially insoluble and/or infusible. The second substrate 112 may wholly or substantially comprise the C-stage material prior to attachment of the second substrate 112 to the first substrate 102.

Referring to FIG. 1C, a semiconductor package 100C is depicted subsequent to forming an electrically insulative structure 116 to substantially encapsulate the semiconductor die 104. In an embodiment, the electrically insulative structure 116 is formed by depositing (e.g., injecting) an electrically insulative material such as, for example, an encapsulation resin comprising an epoxy, through the one or more channels 114 to substantially fill the region (e.g., region 115 of FIG. 1B) for the semiconductor die 104. The deposited electrically insulative material may further substantially fill the one or more channels 114, as shown.

A curing process may be used to apply heat or other energy to the material deposited to form the electrically insulative structure 116 in order to toughen and/or harden the material and form a final structure. Subsequently, a polishing process may be applied to the electrically insulative structure 116 and the second surface (e.g., second surface B2 of FIG. 1B) of the second substrate 112 to provide a substantially planar surface, as shown.

One or more vias 118 may be formed in the second substrate 112 to provide an electrical connection between the second surface (e.g., second surface B2 of FIG. 1B) of the second substrate 112 and the first substrate 102, as shown. The one or more vias 118 can be used, for example, to provide an electrical connection between the semiconductor die 104 and one or more structures (e.g., a build-up layer, not shown) or another electronic component or device (e.g., another die, not shown) coupled to the second surface of the second substrate 112. The one or more vias 118 are generally filled with an electrically conductive material, such as, for example, copper, and can include any suitable electrically conductive material. In an embodiment, the one or more vias 118 are formed using a laser-drilling process.

One or more package interconnect structures 120 may be coupled to a bottom surface of the first substrate 102 to facilitate electrical coupling of the semiconductor package 100C with one or more electronic devices (e.g., motherboard or other circuit board, not shown) external to the semiconductor package 100C. In an embodiment, the one or more package interconnect structures 120 comprise solder balls. Other types of package interconnect structures can be used in other embodiments.

Figure 2A:
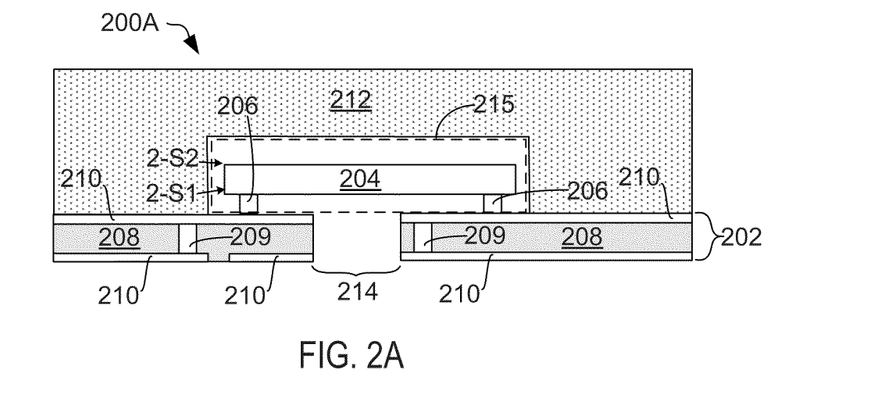
FIGS. 2A-2B schematically illustrate another semiconductor package subsequent to various process operations, in accordance with various embodiments.
Figure 2B:
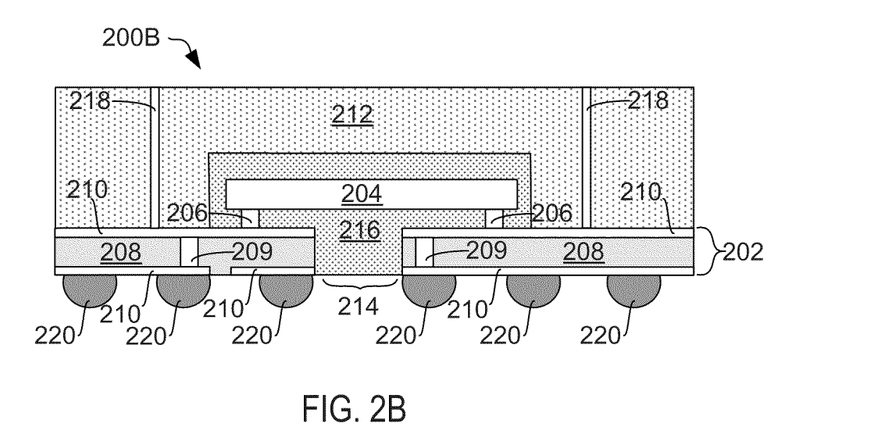

FIGS. 2A-2B schematically illustrate another semiconductor package subsequent to various process operations, in accordance with various embodiments. Referring to FIG. 2A, a semiconductor package 200A is depicted subsequent to attaching a semiconductor die 204 to a first substrate 202 and subsequent to attaching a second substrate 212 to the first substrate 202 to embed the semiconductor die 204 between the first substrate 202 and the second substrate 212. Except where otherwise indicated, techniques and corresponding features of the semiconductor die 204, the first substrate 202, and the second substrate 212, may comport with embodiments for analogous features already described in connection with FIG. 1A.

The semiconductor die 204 includes a first surface, 2-S1, which may be an active surface upon which a plurality of IC devices (not shown) are formed and a second surface, 2-S2 opposite to the first surface 2-S1. The first surface 2-S1 of the semiconductor die 204 is electrically coupled to the first substrate 202 using one or more interconnect bumps 206 to provide an electrical pathway for power and/or I/O signals to or from the semiconductor die 204.

The first substrate 202 includes one or more traces 210 or similar features formed on opposing surfaces of the first substrate 202, as shown, and one or more vias 209 to route electrical signals to or from the semiconductor die 204. In an embodiment, the first substrate 202 includes a core 208 comprising polyimide. According to various embodiments, the first substrate 202 and the semiconductor die 204 are configured in an arrangement as shown and described in connection with the semiconductor package 100A of FIG. 1A prior to attachment of the second substrate 212 to the first substrate 202.

A channel 214 (e.g., injection channel) is formed in the first substrate 202 to provide a pathway for deposition of an electrically insulative material to encapsulate the semiconductor die 204. The channel 214 is disposed adjacent to the semiconductor die 204 when the semiconductor die 204 is attached to the first substrate 202, as shown. The channel 214 is formed prior to forming an electrically insulative structure (e.g., electrically insulative structure 216 of FIG. 2B) to encapsulate the semiconductor die 204. A plurality of channels may be formed in place of a single channel (e.g., channel 214) in the first substrate 202, in some embodiments, to facilitate a more uniform flow distribution of electrically insulative material. Any suitable process can be used to form the channel 214 including, for example, stamping, etching, drilling or using a mold.

The second substrate 212 includes a region 215 for the semiconductor die 204 such that the semiconductor die 204 is disposed within the region 215 subsequent to attaching the second substrate 212 to the first substrate 202, as shown. The region 215 can be formed according to techniques described in connection with region 115 of FIG. 1. According to various embodiments, the second substrate 212 comprises a printed circuit board. The second substrate 212 may comprise a laminate substrate.

Referring to FIG. 2B, a semiconductor package 200B is depicted subsequent to forming an electrically insulative structure 216 to substantially encapsulate the semiconductor die 204. In an embodiment, the electrically insulative structure 216 is formed by depositing (e.g., injecting) an electrically insulative material such as, for example, an encapsulation resin comprising an epoxy, through the channel 214 to substantially fill the region (e.g., region 215 of FIG. 2A) for the semiconductor die 204. The deposited electrically insulative material may further substantially fill the channel 214, as shown.

A curing process may be used to apply heat or other energy to the material deposited to form the electrically insulative structure 216 in order to toughen and/or harden the material. Subsequently, a polishing process may be applied to the electrically insulative structure 216 and/or a bottom surface of the first substrate 202 to provide a substantially planar surface, as shown.

Referring to FIG. 2C, one or more vias 218 may be formed in the second substrate 212 to provide an electrical connection between opposing surfaces of the second substrate 112, as shown. The one or more vias 218 can be used, for example, to provide an electrical connection between the semiconductor die 204 and one or more structures (e.g., a build-up layer, not shown) or another electronic component or device (e.g., another die, not shown) coupled to a top surface of the second substrate 212. The one or more vias 218 are generally filled with an electrically conductive material, such as, for example, copper, and can include any suitable electrically conductive material. In an embodiment, the one or more vias 218 are formed using a laser-drilling process.

One or more package interconnect structures 220 may be coupled to a bottom surface of the first substrate 202 to facilitate electrical coupling of the semiconductor package 200B with one or more electronic devices (e.g., motherboard or other circuit board, not shown) external to the semiconductor package 200B. In an embodiment, the one or more package interconnect structures 220 comprise solder balls. Other types of package interconnect structures can be used in other embodiments.

Figure 3A:
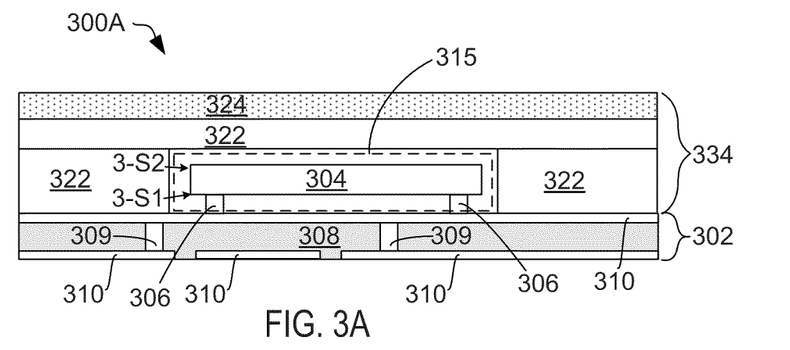
FIGS. 3A-3C schematically illustrate yet another semiconductor package subsequent to various process operations, in accordance with various embodiments.
Figure 3B:
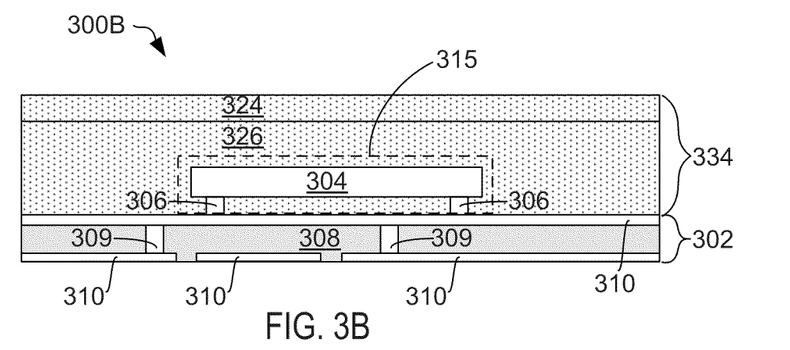
Figure 3C:
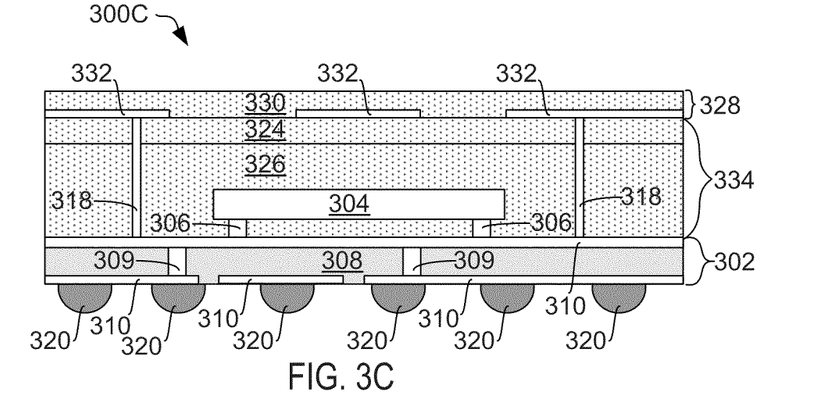

FIGS. 3A-3C schematically illustrate yet another semiconductor package subsequent to various process operations, in accordance with various embodiments. Referring to FIG. 3A, a semiconductor package 300A is depicted subsequent to attaching a semiconductor die 304 to a first substrate 302 and subsequent to attaching a second substrate 334 to the first substrate 302 to embed the semiconductor die 304 between the first substrate 302 and the second substrate 312. Except where otherwise indicated, techniques and corresponding features of the semiconductor die 304, the first substrate 302, and the second substrate 334, may comport with embodiments for analogous features already described in connection with FIG. 1A.

The semiconductor die 304 includes a first surface, 3-S1, which may be an active surface upon which a plurality of IC devices (not shown) are formed and a second surface, 3-S2 opposite to the first surface 3-S1. The first surface 3-S1 of the semiconductor die 304 is electrically coupled to the first substrate 302 using one or more interconnect bumps 306 to provide an electrical pathway for power and/or I/O signals to or from the semiconductor die 304.

The first substrate 302 includes one or more traces 310 or similar features formed on opposing surfaces of the first substrate 302, as shown, and one or more vias 309 to route electrical signals to or from the semiconductor die 304. In an embodiment, the first substrate 302 includes a core 308 comprising polyimide. According to various embodiments, the first substrate 302 and the semiconductor die 304 are configured in an arrangement as shown and described in connection with the semiconductor package 100A of FIG. 1A prior to attachment of the second substrate 334 to the first substrate 302.

According to various embodiments, the second substrate 334 is attached to the first substrate 302 by depositing a B-stage prepreg material to substantially surround the semiconductor die 304. The B-stage prepreg material may include fusible materials pre-impregnated with resin such as intermediate stage thermosetting resins in which the material may soften when heated, but may not entirely dissolve or fuse. The B-stage prepreg material is generally not fully cured.

One or more B-stage prepreg structures 322 may be deposited, as shown, to substantially surround the semiconductor die 304. The one or more B-stage prepreg structures 322 are configured to form a region 315 for the semiconductor die 304 such that the semiconductor die 304 is disposed within the region 315 subsequent to depositing the one or more B-stage prepreg structures 322.

A C-stage layer 324 comprising a C-stage material is deposited on the one or more B-stage prepreg structures 322 such that the semiconductor die 304 is disposed between the C-stage layer 324 and the first substrate 308, as shown. The C-stage layer 324 reduces and/or eliminates warping of the second substrate 334 during a curing process to convert the B-stage prepreg structures 322 into a C-stage structure (e.g., C-stage structure 326 of FIG. 3B as will be described). According to various embodiments, the C-stage layer 324 has a coefficient of thermal expansion (CTE) that is substantially the same as a CTE of material (e.g., polyimide) used to fabricate the first substrate 308. The B-stage prepreg structures 322 and the C-stage layer 324 may comprise laminates of the second substrate 334.

Referring to FIG. 3B, a semiconductor package 300B is depicted subsequent to converting the B-stage prepreg structures 322 into a C-stage structure 326. The one or more B-stage prepreg structures 322 are generally converted into the C-stage structure 326 using a curing process that fuses the B-stage prepreg structures 322 and causes material of the B-stage prepreg structures 322 to form an electrically insulative structure (e.g., portion of the C-stage structure 326 within region 315) that substantially encapsulates the semiconductor die 304. Pressure may be applied to facilitate the curing process.

One or more vias 318 may be formed in the second substrate 334 to provide an electrical connection between opposing surfaces of the second substrate 334, as shown. The one or more vias 318 can be used, for example, to provide an electrical connection between the semiconductor die and one or more structures (e.g., build-up layer 328) or another electronic component or device (e.g., another die, not shown) coupled to a top surface of the second substrate 334. The one or more vias 318 are generally filled with an electrically conductive material, such as, for example, copper, and can include any suitable electrically conductive material. In an embodiment, the one or more vias 318 are formed using a laser-drilling process.

A build-up layer 328 may be formed on the second substrate 334, as shown. The build-up layer 329 includes one or more traces 332 or similar features that are electrically coupled to the one or more vias 318 to route electrical signals to or from the semiconductor die 304. The build-up layer 328 further includes an electrically insulative material 330 to protect and/or provide electrical insulation for the one or more traces 332. According to various embodiments, the electrically insulative material 330 comprises a laminate as generally used in laminate substrates.

One or more package interconnect structures 320 may be coupled to a bottom surface of the first substrate 302 to facilitate electrical coupling of the semiconductor package 300C with one or more electronic devices (e.g., motherboard or other circuit board, not shown) external to the semiconductor package 300C. In an embodiment, the one or more package interconnect structures 320 comprise solder balls. Other types of package interconnect structures can be used in other embodiments.

Figure 4:
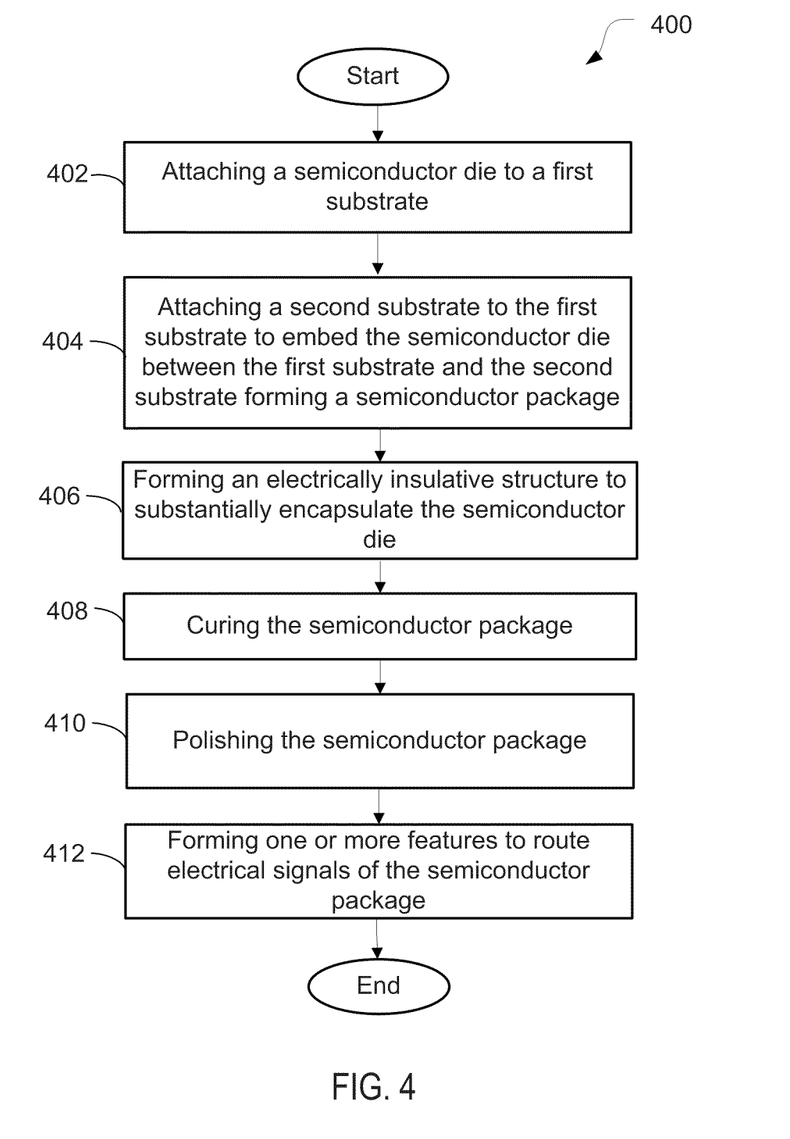
FIG. 4 is a process flow diagram of a method to fabricate a semiconductor package, in accordance with various embodiments.

FIG. 4 is a process flow diagram of a method 400 to fabricate a semiconductor package (e.g., semiconductor package 100C of FIG. 1C, 200B of FIG. 1B, or 300C of FIG. 1C), in accordance with various embodiments. At 402, the method 400 includes attaching a semiconductor die (e.g., semiconductor die 104 of FIG. 1A) to a first substrate (e.g., first substrate 102 of FIG. 1A). For example, the semiconductor die may be attached to the first substrate using a flip-chip configuration. A bumping process may be used to form one or more interconnect bumps (e.g., interconnect bumps 106 of FIG. 1A) such as, for example, stud-bumps on a surface (e.g., first surface S1 of FIG. 1A) of the semiconductor die. The bumps may be formed on an active surface of the semiconductor die having a plurality of IC devices formed thereon. The one or more interconnect bumps are electrically coupled to corresponding receiving structures (e.g., bond pads, one or more traces 110 of FIG. 1A) formed on a surface of the first substrate. In an embodiment, the first substrate includes a core (e.g., core 108 of FIG. 1A) comprising polyimide such as, for example, a flex circuit substrate.

At 404, the method 400 further includes attaching a second substrate to the first substrate to embed the semiconductor die between the first substrate and the second substrate forming a semiconductor package. The second substrate can be attached using any suitable known technique for coupling substrates together including, for example, adhesives, or interconnect structures. The second substrate can include, for example, a pre-fabricated substrate for attachment or B-stage materials such as prepreg laminates to form the second substrate on the first substrate.

According to various embodiments, the second substrate (e.g., second substrate 112 or 212 of respective FIG. 1B or 2A) comprises a printed circuit board or analogous product that is fabricated to include a region (e.g., region 115 or 215 of respective FIG. 1B or 2A) for the semiconductor die prior to attaching the second substrate to the first substrate. The region is disposed such that the semiconductor die is disposed within the region subsequent to attaching the second substrate to the first substrate.

In an embodiment, the second substrate (e.g., second substrate 112 of FIG. 1B) includes a first surface (e.g., first surface B1 of FIG. 1B) that is attached to the first substrate and a second surface (e.g., second surface B2 of FIG. 1B) that is opposite to the first surface. The second substrate may further include a plurality of channels (e.g., one or more channels 114 of FIG. 1B) formed between the second surface and the region for the semiconductor die. The first surface of the second substrate can be attached to the first substrate using any suitable technique including using an adhesive such as, for example, an epoxy. Other suitable techniques can be used to attach the second substrate to the first substrate in other embodiments.

In another embodiment, attaching the second substrate (e.g., second substrate 334 of FIG. 3A) to the first substrate (e.g., first substrate 302 of FIG. 3A) comprises depositing a B-stage prepreg material to substantially surround the semiconductor die (e.g., semiconductor die 304 of FIG. 3A). For example, the B-stage prepreg material may be in the form of one or more B-stage prepreg structures (e.g., one or more B-stage prepreg structures 322 of FIG. 3A) that are configured to provide a region (e.g., region 315 of FIG. 3A) for the semiconductor die such that the semiconductor die is disposed within the region subsequent to deposition of the B-stage prepreg material. Attaching the second substrate to the first substrate may further comprise depositing a C-stage material (e.g., C-stage layer 324) on the B-stage prepreg material such that the semiconductor die is disposed between the C-stage material and the first substrate. The C-stage material may have a coefficient of thermal expansion (CTE) that is substantially the same as a CTE of material used to fabricate the first substrate to reduce and/or prevent warping of the B-stage prepreg material during a subsequent cure process.

At 406, the method 400 further includes forming an electrically insulative structure to substantially encapsulate the semiconductor die. According to various embodiments, the electrically insulative structure is formed subsequent to attaching the second substrate to the first substrate. In some embodiments, the electrically insulative structure (e.g., electrically insulative structure 116 or 216 of respective FIG. 1C or 2B) is formed by depositing an electrically insulative material to substantially fill the region (e.g., region 115 or 215 of respective FIG. 1B or 2A) for the semiconductor die.

In one embodiment, the electrically insulative material is deposited through one or more channels (e.g., one or more channels 114 of FIG. 1B) formed in the second substrate (e.g., second substrate 112 of FIG. 1B) to substantially fill the region for the semiconductor die and the one or more channels. The one or more channels can be formed in the second substrate, e.g., by a stamping process, prior to attaching the semiconductor die to the first substrate or prior to attaching the second substrate to the first substrate. In another embodiment, the electrically insulative material is deposited through one or more channels (e.g., channel 214 of FIG. 2A) formed in the first substrate to substantially fill the region for the semiconductor die and the one or more channels. The one or more channels are formed in the first substrate prior to forming the electrically insulative structure. The one or more channels can be formed in the first substrate, e.g., by a stamping process, prior to attaching the semiconductor die to the first substrate. The electrically insulative material can be deposited using any of a variety of suitable deposition techniques including, for example, injection techniques and can include any of a variety of suitable materials including, for example, an epoxy resin or other encapsulation resin.

At 408, the method 400 further includes curing the semiconductor package. Heat or other energy may be applied to the semiconductor package to cure or harden the electrically insulative structure (e.g., electrically insulative structure 116 or 216 of respective FIG. 1C or 2B).

In some embodiments, the electrically insulative structure (e.g., portion of C-stage structure 326 within region 315 of FIG. 3B) is formed at 406 by curing the semiconductor package at 408 to convert one or more B-stage prepreg structures (e.g., one or more B-stage prepreg structures 322 of FIG. 3A) into a C-stage structure 326 (e.g., C-stage structure 326 of FIG. 3B). For example, a curing process that fuses the B-stage prepreg structures 322 causes material of the B-stage prepreg structures 322 to flow and form the electrically insulative structure.

At 410, the method 400 further includes polishing the semiconductor package. In an embodiment, a surface (e.g., second surface B2 of FIG. 1B) of the second substrate (e.g., second substrate 112 of FIG. 1C) that includes the electrically insulative structure (e.g., electrically insulative structure 116 of FIG. 1C) undergoes a polishing process to provide a substantially planar surface. That is, excess portions of the electrically insulative structure that extend out of the one or more channels (e.g., one or more channels 114 of FIG. 1C) are polished to remove the material and provide a planar surface.

In another embodiment, a surface (e.g., bottom surface of first substrate 202 of FIG. 2B) of the first substrate is polished. The surface of the first substrate may be polished, for example, to remove excess portions of the electrically insulative structure (e.g., electrically insulative structure 216 of FIG. 2B) that extend out of the channel (e.g., channel 214 of FIG. 2B) and to provide a planar surface.

At block 412, the method 400 further includes forming one or more features (e.g., vias, traces, bond pads, build-up layers, interconnect structures) to route electrical signals of the semiconductor package. In some embodiments, one or more vias (e.g., one or more vias 118, 218, or 318 of respective FIG. 1C, 2B, or 3B) are formed to electrically couple opposing surfaces (e.g., first surface B1 and second surface B2 of FIG. 1B) of the second substrate. For example, the one or more vias may include, for example, laser-drilled vias that electrically couple the first substrate to one or more structures (e.g., build-up layer 328 of FIG. 3C) or another electronic component or device (e.g., another die, not shown) coupled to a surface of the second substrate.

In some embodiments, a build-up layer (e.g., build-up layer 328 of FIG. 3C) is formed on the second substrate. The build-up layer may include, for example, traces (e.g., one or more traces 332 of FIG. 3C) or similar features that are electrically coupled to the first substrate through the one or more vias. Generally, the build-up layer includes an electrically insulative material to protect and/or electrically insulate the traces.

In some embodiments, one or more package interconnect structures (e.g., 120, 220, or 320 of respective FIG. 1C, 2B, or 3C) are formed to provide an electrical connection between the semiconductor package (e.g., 100C, 200B, or 300C of respective FIG. 1C, 2B, or 3C) and an electronic device external to the semiconductor package. The one or more package interconnect structures can include, for example, solder balls. Other suitable types of package interconnect structures can be used in other embodiments. In general, techniques and configurations described in connection with FIGS. 1A-1C, 2A-2B, and 3A-3C may be suitably combined in some embodiments.

Figure 5:
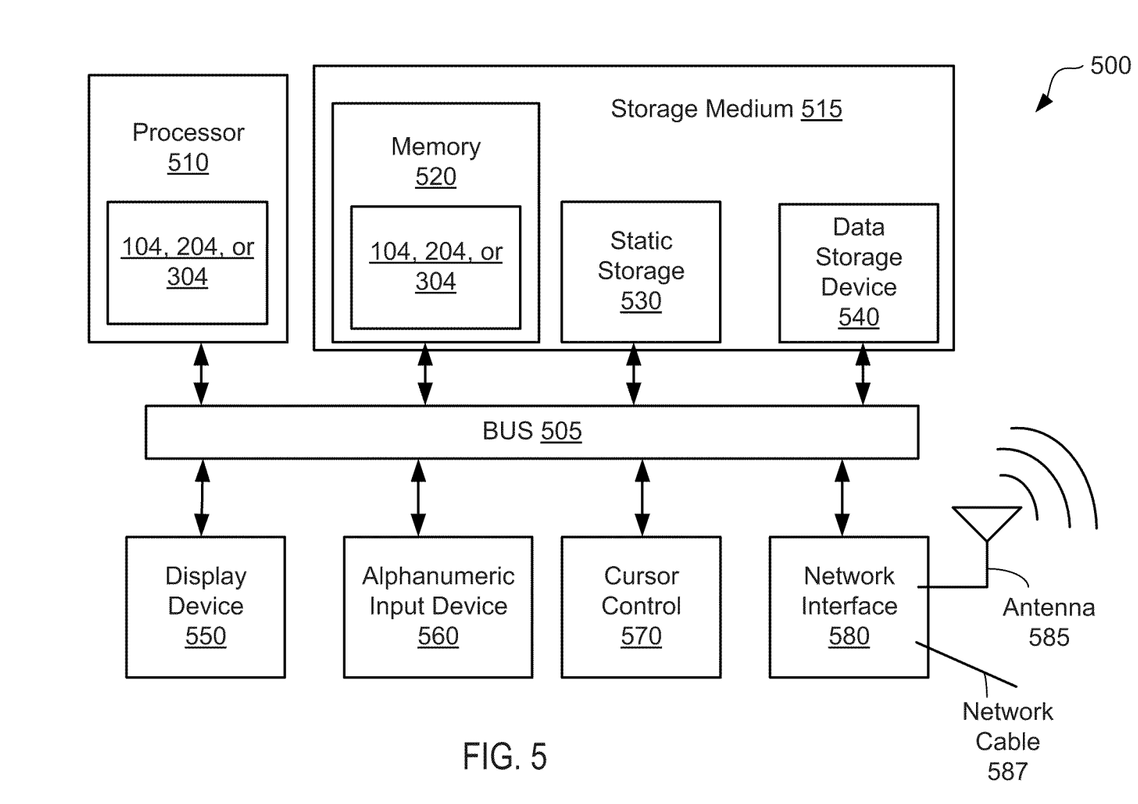
FIG. 5 schematically illustrates an electronic system configured to use a semiconductor package as described herein.

FIG. 5 schematically illustrates an electronic system 500 configured to use a semiconductor package (e.g., 100C, 200B, or 300C of respective FIG. 1C, 2B, or 3C) as described herein. Electronic system 500 is intended to represent a range of electronic devices (either wired or wireless) including, for example, desktop computer devices, laptop computer devices, personal computers (PC), servers, printers, phones, personal digital assistants (PDA) including cellular-enabled PDAs, set top boxes, televisions, pocket PCs, tablet PCs, DVD players, video players, but is not limited to these examples and can include other electronic devices. Alternative electronic systems can include more, fewer and/or different components.

The electronic system 500 includes a bus 505 or other communication device or interface to communicate information, and processor 510 coupled to bus 505 to process information. Bus 505 can be a single system bus or a number of buses of the same or different types bridged together. The processor 510 is representative of one or more processors and/or co-processors. In one embodiment, the processor is a semiconductor die (e.g., semiconductor die 104, 204, or 304 of respective FIG. 1C, 2B, or 3C) configured in a semiconductor package (e.g., 100C, 200B, or 300C of respective FIG. 1C, 2B, or 3C) as described herein.

The electronic system 500 also includes a storage medium 515, which represents a variety of types of storage including memory 520, static storage 530, and data storage device 540. The storage medium 515 is coupled to bus 505 to store information and/or instructions that are processed and/or executed by processor 510. The storage medium 515 can include more or less types of storage than depicted.

The electronic system 500 includes random access memory (RAM) or other storage device 520 (may be referred to as "memory"), coupled to bus 505. The memory 520 is used to store temporary variables or other intermediate information during execution of instructions by processor 510. Memory 520 includes, for example, a flash memory device. In one embodiment, memory 520 includes a semiconductor die (e.g., semiconductor die 104, 204, or 304 of respective FIG. 1C, 2B, or 3C) configured in a semiconductor package (e.g., 100C, 200B, or 300C of respective FIG. 1C, 2B, or 3C) as described herein.

The electronic system 500 can also include read only memory (ROM) and/or other static storage device 530 coupled to bus 505 to store static information and instructions for processor 510. Data storage device 540 may be coupled to bus 505 to store information and instructions. Data storage device 540 can include, for example, a magnetic disk or optical disc and corresponding drive coupled with the electronic system 500.

The electronic system 500 is coupled via bus 505 to display device 550, such as a cathode ray tube (CRT) or liquid crystal display (LCD), to display information to a user. Alphanumeric input device 560, including alphanumeric and other keys, can be coupled to bus 505 to communicate information and command selections to the processor 510. Cursor control 570 is another type of input device and includes, for example, a mouse, a trackball, or cursor direction keys to communicate information and command selections to the processor 510 and to control cursor movement on the display 550.

The electronic system 500 further includes one or more network interfaces 580 to provide access to network 520, such as a local area network, but is not limited in this regard. The network interface 580 can include, for example, a wireless network interface having antenna 585, which may represent one or more antennae. The network interface 580 can also include, for example, a wired network interface to communicate with remote devices via network cable 587, which can be, for example, an Ethernet cable, a coaxial cable, a fiber optic cable, a serial cable, or a parallel cable.

Although certain embodiments have been illustrated and described herein, a wide variety of alternate and/or equivalent embodiments or implementations calculated to achieve the same purposes may be substituted for the embodiments illustrated and described without departing from the scope of the present disclosure. This disclosure is intended to cover any adaptations or variations of the embodiments discussed herein. Therefore, it is manifestly intended that embodiments described herein be limited only by the claims and the equivalents thereof.

What is claimed is:

1. A method of fabricating a semiconductor package, the method comprising:
   attaching a semiconductor die to a first substrate, wherein the first substrate comprises electrically insulative material, wherein attaching the semiconductor die to the first substrate comprises electrically coupling the semiconductor die and the first substrate using one or more interconnect bumps;
   attaching a second substrate to the first substrate such that a first surface of the second substrate is directly attached to a first surface of the first substrate, wherein the semiconductor die is embedded in between the first substrate and the second substrate;
   forming an electrically insulative structure to substantially encapsulate the semiconductor die, wherein forming the electrically insulative structure is performed subsequent to the second substrate being attached to the first substrate, wherein the second substrate is attached to the first substrate by depositing a B-stage prepreg material to substantially surround the semiconductor die; and
   depositing a C-stage material on the B-stage prepreg material such that the semiconductor die is disposed between the C-stage material and the first substrate, the C-stage material having a coefficient of thermal expansion that is substantially the same as a coefficient of thermal expansion of material used to fabricate the first substrate,
   wherein forming the electrically insulative structure comprises curing the B-stage prepreg material to convert the B-stage prepreg material to a converted C-stage material.

2. The method of claim 1, further comprising curing the electrically insulative structure.

3. The method of claim 1, further comprising polishing the electrically insulative structure to provide a substantially planar surface on the first substrate or the second substrate.

4. The method of claim 1, wherein attaching the semiconductor die to the first substrate comprises using a stud-bumping process to electrically couple the semiconductor die and the first substrate using one or more interconnect bumps.

5. The method of claim 1, further comprising:
   forming one or more vias in the second substrate to provide an electrical connection between a second surface of the second substrate and the first substrate.

6. The method of claim 1, wherein:
   the first substrate includes a core comprising polyimide.

7. The method of claim 1, further comprising:
   forming one or more vias through the deposited C-stage material and the converted C-stage material; and
   forming a build-up layer on the deposited C-stage material, the build-up layer including traces that are electrically coupled to the first substrate through the one or more vias.

8. The method of claim 1, wherein curing the B-stage prepreg material to convert the B-stage prepreg material to the converted C-stage material further comprises:
   fusing the B-stage prepreg material, thereby causing the B-stage prepreg material to form the electrically insulative structure.

9. The method of claim 1, wherein the B-stage prepreg material comprises fusible materials pre-impregnated with resin.

10. The method of claim 1, wherein the B-stage prepreg material comprises intermediate stage thermosetting resins.

11. The method of claim 1, wherein the C-stage material deposited on the B-stage prepreg material facilitates in reduction of warping of the second substrate, while curing the B-stage prepreg material to convert the B-stage prepreg material to the converted C-stage material.

* * * * *